United States Patent [19]
Brunet et al.

[11] Patent Number: 5,508,884
[45] Date of Patent: Apr. 16, 1996

[54] SYSTEM FOR DISSIPATING HEAT ENERGY GENERATED BY AN ELECTRONIC COMPONENT AND SEALED ENCLOSURE USED IN A SYSTEM OF THIS KIND

[75] Inventors: Patrice Brunet, Courbevoie; Gilles Avignon, Argenteuil; Franck Heron, Antony, all of France

[73] Assignee: Alcatel Telspace, Nanterre Cedex, France

[21] Appl. No.: 457,302

[22] Filed: Jun. 1, 1995

Related U.S. Application Data

[63] Continuation of Ser. No. 166,952, Dec. 15, 1993, abandoned.

[30] Foreign Application Priority Data

Dec. 16, 1992 [FR] France ................... 92 15166

[51] Int. Cl.⁶ ................................................. H05K 7/20
[52] U.S. Cl. ................... 361/698; 165/80.4; 165/164.33; 257/714; 361/700
[58] Field of Search .......................... 237/66; 174/15.2; 62/259.2; 257/712, 714, 721, 722; 361/689–691, 698–700, 722; 165/32, 39, 80.5, 104.21, 104.23, 104.27, 104.28, 104.33, 104.34, 80.4, 46

[56] References Cited

U.S. PATENT DOCUMENTS

| | | | |
|---|---|---|---|
| 2,695,753 | 11/1954 | Kirk, Jr. | 237/66 |
| 4,019,098 | 4/1977 | McCready | 361/385 |
| 4,106,557 | 8/1978 | Sonobe | 165/105 |
| 4,327,399 | 4/1982 | Sasaki et al. | |
| 4,635,709 | 1/1987 | Altoz | 165/32 |
| 4,949,164 | 8/1990 | Ohashi | 357/82 |
| 5,057,909 | 10/1991 | Mok | 357/81 |
| 5,131,233 | 7/1992 | Cray | 62/64 |
| 5,168,919 | 12/1992 | Berenholz | 165/104.33 |
| 5,305,184 | 4/1994 | Andersen | 361/699 |
| 5,316,077 | 5/1994 | Reichhard | 165/104.28 |
| 5,413,965 | 5/1995 | Webb | 437/219 |

FOREIGN PATENT DOCUMENTS

| | | | |
|---|---|---|---|
| 2298372 | 1/1989 | European Pat. Off. | |
| 1359975 | 3/1964 | France | 165/104.33 |

Primary Examiner—Gerald P. Tolin
Attorney, Agent, or Firm—Sughrue, Mion, Zinn, Macpeak & Seas

[57] ABSTRACT

System for dissipating heat energy generated by an electronic component and sealed enclosure used in a system of this kind.

The system for dissipating heat of the invention is of the type comprising a sealed metal enclosure (21) the interior volume of which contains a fluid (22), said component (11) being fixed to the outside wall of said enclosure (21) and connected to a heat dissipator (12) by said enclosure (21) and is characterized in that the phase change temperature of the fluid (22) at atmospheric pressure is less than a given maximum ambient temperature and in that said enclosure (21) also contains a volume of gas (23) different from the fluid (22) so that variation in the ambient temperature causes a variation in the pressure inside the enclosure (21) which modifies the phase change temperature of the fluid (22).

9 Claims, 3 Drawing Sheets

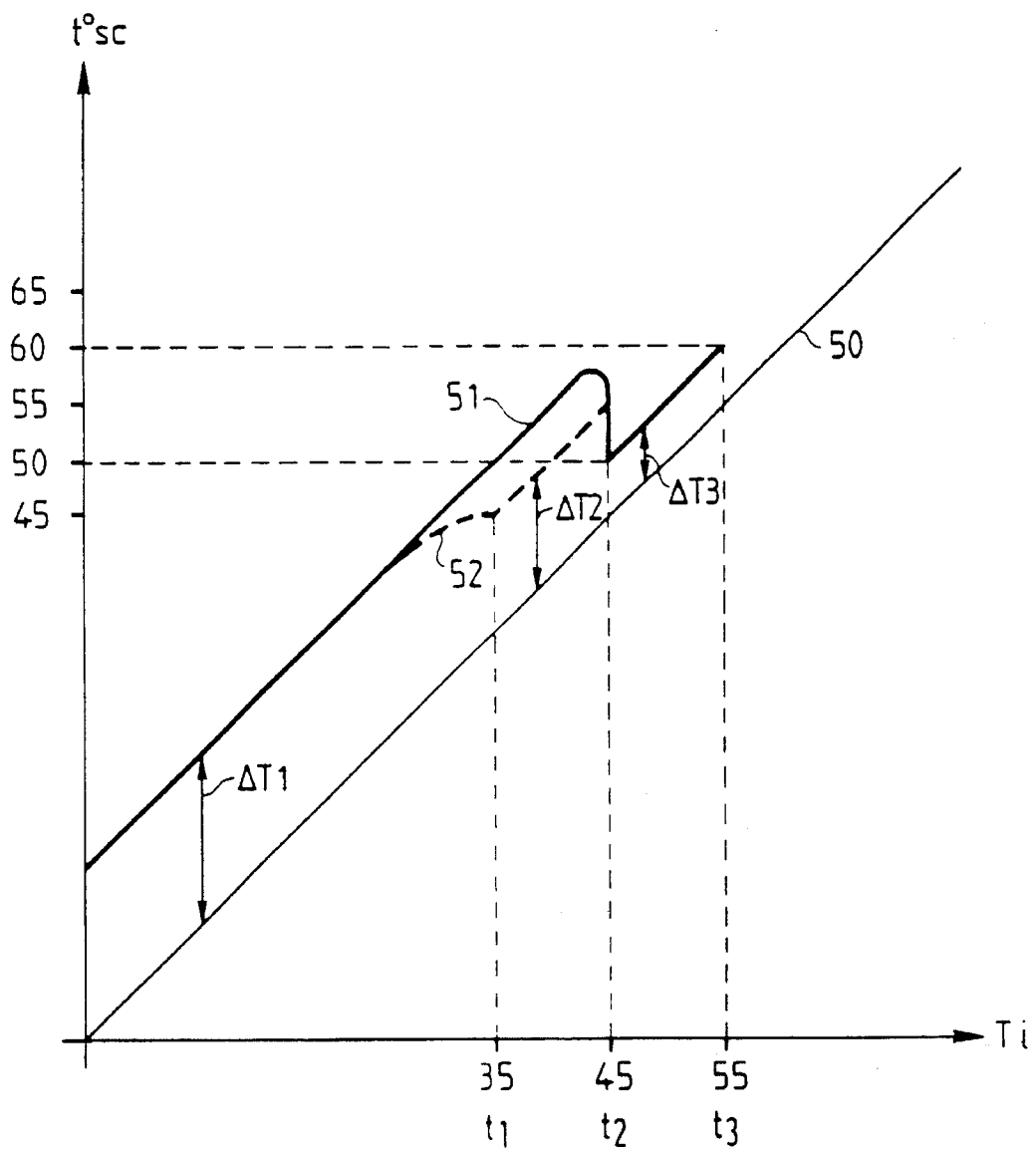

SYSTEM FOR DISSIPATING HEAT ENERGY GENERATED BY AN ELECTRONIC COMPONENT AND SEALED ENCLOSURE USED IN A SYSTEM OF THIS KIND

This is a continuation of application Ser. No. 08/166,952 filed Dec. 15, 1993, now abandoned.

System for dissipating heat energy generated by an electronic component and sealed enclosure used in a system of this kind.

The field of the invention is that of dissipating heat energy generated by an electronic component.

Some electronic components, such as high-frequency power transistors which generate a large amount of heat energy, for example, require cooling means capable of dissipating this energy effectively. These components are usually mounted on heat dissipators which incorporate cooling fins.

Mounting the component to be cooled directly on a heatsink produces a very low thermal resistance between the two parts but has the drawback of restricting heat exchange to the surface area of the heat source of the component.

There is known a heat dissipating system which uses a member called a heat pipe between the component to be cooled and a heatsink. A heat pipe is a thermal connection device constituted by a pipe which contains a fluid which vaporizes at a given temperature. Any sufficient input of heat to any point on the heat pipe causes a small quantity of the fluid to vaporize and absorbs the latent heat of vaporization. The vapor formed moves along the pipe and condenses at a cooler point, releasing the latent heat. The enclosure also includes a capillary network enabling the condensate to return to the component.

FIG. 1 is a diagrammatic cross-section view of a dissipating system of this kind.

A dissipating system using a heat pipe includes an electronic component 11 whose temperature is to be controlled, a heat dissipator 12 in the form of a finned heatsink and heat pipe 12 between the component 11 and the heatsink 12. The component 11 and the dissipator 12 are fixed to the same wall 19 of the heat pipe 13. The heat pipe 13 is constituted by a sealed enclosure 14 containing a fluid 15 and a capillary network 16. If the temperature of the component 11 rises above the temperature at which the fluid 15 vaporizes, the fluid vaporizes and the resulting vapor moves in a direction 17 towards a cooler area. At the dissipator 12 this vapor is returned to the fluid state and the fluid moves towards the hot area through the capillary network 16 in a direction 18.

A heat pipe of this kind has a very low thermal resistance which is favorable to thermal contact between the component 11 and the dissipator 12 but its main drawback is that it assumes that the component 11 is at all times at a temperature above the expected maximum ambient temperature. A heat pipe-based dissipating system is characterized by an operating point at a fixed temperature above the maximum ambient temperature.

For outdoor use in hot weather when the ambient temperature can reach 55° C., for example, it is necessary to use a fluid whose (fluid-vapor) phase change temperature is greater than 55° C., for example equal to 60° C. In this case, for the heat pipe 13 to be able to operate irrespective of the ambient temperature the component 11 must be at an operating temperature such that its bottom plate temperature is greater than 60°, 65° C., for example, all the year round. If the bottom plate of the component 11 must be held at a temperature of this magnitude, the temperature of its junction is much higher, around 150° C., and rapid destruction of the component may result. Artificially caused operation at this minimal bottom plate temperature reduces the service life of the component.

Also, a heat pipe-based dissipating system is of non-negligible bulk because the component must be far enough away from the heat dissipator to allow the fluid in the vapor phase to condense.

There is known from document EP-A-0,298,372 in the name of HITACHI a semiconductor cooling device including a closed casing containing a phase-change fluid ($C_6F_{14}$) and semiconductor components. If the temperature of the components increases the vapor phase fluid rises and then condenses to fall back in liquid form. Pipes are provided for separating the upward and downward flow. The casing contains only one element, present in the liquid phase and the vapor phase.

Document US-A-4,327,399 in the name of SASAKI et al. describes a system for cooling electronic components mounted on a printed circuit. One side of the component is in contact with a fluid in a sealed enclosure. This document also shows that the enclosure contains only one fluid in equilibrium between its liquid phase and its vapor phase.

An object of the present invention is to overcome these drawbacks by providing a system for dissipating the heat energy generated by an electrical component with a very low thermal resistance and which does not require the component to be cooled to operate at a temperature above a given minimal temperature.

Another object of the invention is to reduce the overall size of a dissipating system of this kind.

A further object is to provide an enclosure used in a system of this kind and adapted to provide the coupling between a heat dissipator and a component to be cooled.

These objects, and others that emerge later, are achieved by a system for dissipating heat energy generated by an electronic component comprising a sealed metal enclosure the interior volume of which contains a fluid, the component being fixed to the outside wall of said enclosure and connected to a heat dissipator by said enclosure, said system being characterized in that the phase change temperature of the fluid at atmospheric pressure is less than a given maximum ambient temperature and in that the enclosure also contains a volume of gas different from the fluid so that variation in the ambient temperature causes a variation in the pressure inside the enclosure which modifies the phase change temperature of the fluid.

In this way the partial pressure of the gap inside the enclosure varies according to the variation in the volume available which in turn depends on the ambient temperature.

The enclosure advantageously includes two substantially parallel walls and the component and the dissipator are each fixed to one of the walls.

The enclosure is then sandwiched between the component and the dissipator and the overall size is much smaller than with a heat pipe system.

In another embodiment the component and the dissipator are fixed to the same wall of the enclosure.

The enclosure preferably includes at least one pressurized gas concentration area which is not filled with the fluid when the ambient temperature is below the maximum ambient temperature, this area enabling the fluid to establish thermal contact between the component and the dissipator.

In a preferred embodiment the component is a microwave transistor mounted in an electromagnetic shield box.

The ratio by which the enclosure is filled with the fluid is advantageously equal to:

$$\frac{V_0}{v_0} = \frac{1}{\beta} \cdot \left[ \frac{1}{\Delta T} - \frac{P_0}{P_i \cdot \Delta T} - \frac{P_0}{P_i T_0} \right]$$

with $v_0 = v_i + V_0 \cdot \beta \cdot \Delta T$
where:

$V_0$ is the volume of fluid used;

$v_0$ is the residual volume of gas inside the enclosure under initial conditions;

$\beta$ is the coefficient of thermal expansion of the fluid;

$\Delta T = T_i - T_0$ where $T_i$ is the maximum ambient temperature and $T_0$ is the temperature at which the enclosure is filled;

$P_0$ is the ambient pressure when the enclosure is filled;

$P_i$ is the pressure inside the enclosure at temperature $T_i$;

$v_i$ is the volume of the gas in the enclosure at the pressure $P_i$.

The gas used is preferably air.

The invention also concerns a sealed enclosure used in a system of this kind.

Other features and advantages of the invention emerge from the following description of a plurality of preferred embodiments of the invention given by way of non-limiting illustrative example only and the accompanying drawings in which:

FIG. 5 shows the bottom plate temperature of a component as a function of ambient temperature for cooling systems of the type shown in FIGS. 2 and 3.

Figure 1:
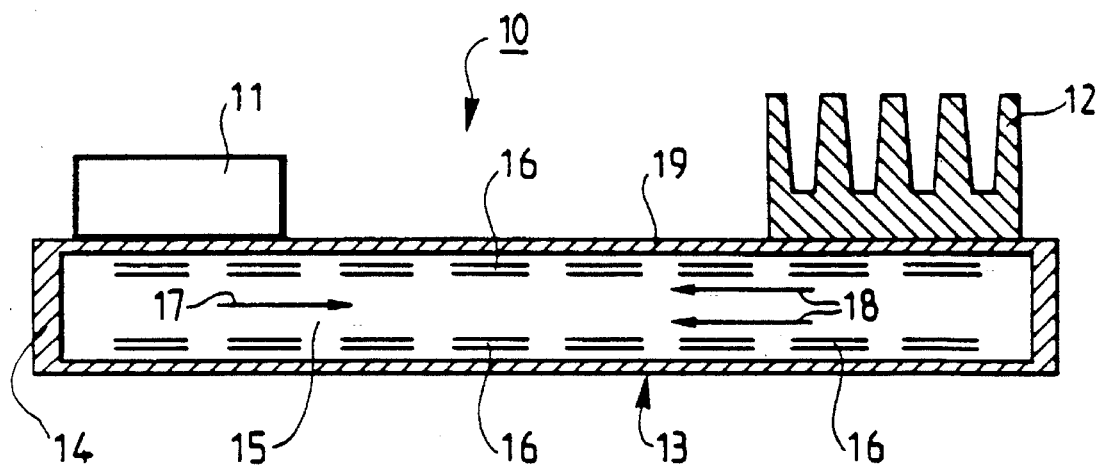
FIG. 1 is a diagrammatic cross-section view of a known system for dissipating heat energy generated by an electronic component.

FIG. 1 concerning a heat pipe-based dissipating system has already been described with reference to the prior art. As explained, this system has the advantage of maintaining a component at a substantially constant temperature irrespective of the ambient temperature but has the drawback that the component to be cooled is held at all times at a temperature greater than the expected ambient temperature.

The present invention proposes to use a dissipating system employing a component which is distinguished from a heat pipe system in that it enables the phase change temperature of a fluid in a sealed enclosure to be slaved to the ambient temperature. In this way an increase in the ambient temperature increases the fluid phase change temperature, which implies a higher boiling point. To this end use is made of a fluid having a low phase change temperature at atmospheric pressure, for example a temperature in the order of 30° C., associated with a gas such as air, for example. This phase change temperature is referred to herein as the nominal phase change temperature. A fluid of this kind is marketed by 3M under the tradename Fluorinert (registered trademarks) and its catalogue number is FC 87.

This fluid is placed in a sealed metal enclosure and parameters such as the proportion of the enclosure that is filled and the temperature at which the fluid is placed in the enclosure are optimized according to the atmospheric pressure so that the phase change temperature "tracks" the ambient temperature, as described below in more detail with reference to FIG. 5.

Figure 2:
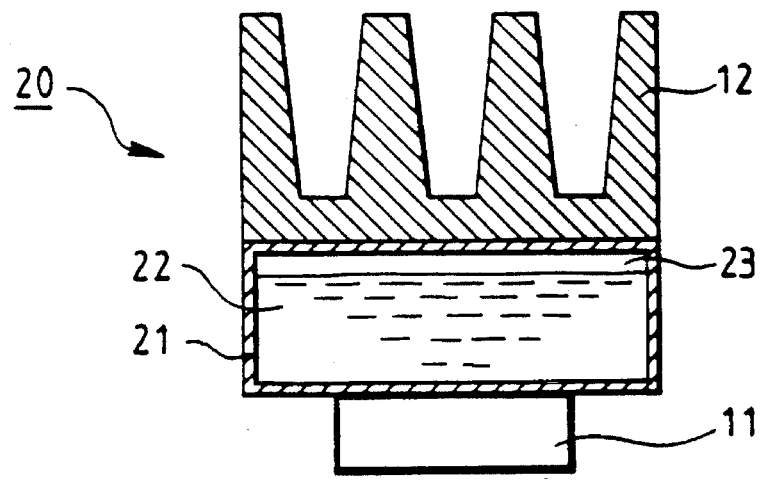
FIGS. 2, 3 and 4 are diagrammatic cross-section views of three preferred embodiments of the present invention.

FIG. 2 is a diagrammatic cross-section view of a first preferred embodiment of the invention.

In this figure the system 20 for dissipating the heat energy generated by a component 11 includes a sealed enclosure 21 the interior volume of which contains a fluid 22 which is able to change phase when heat energy is communicated to it, as in the prior art mentioned previously. The component 11 is disposed against a wall of the enclosure 21 and connected to a heat dissipator 12 by the enclosure 21. The means for fixing the component and the dissipator to the enclosure 1 are not shown and do not form any part of the invention. The enclosure 21 also includes a free volume 23 filled with air, for example, or another gas different from the fluid used, enabling an increase in the pressure inside the enclosure 21 by virtue of expansion of the fluid 22. This expansion occurs if the ambient temperature increases and causes an increase in the partial pressure inside the enclosure 21. This partial pressure is due to the presence of the gas in the enclosure 21. The free volume is obtained when the enclosure 21 is filled with the fluid 22. The expansion of the fluid 22 caused by an increase in ambient temperature reduces the thermal resistance between the component 11 and the dissipator 12 due to the enclosure 21, as is explained below.

FC 87 is characterized by a nominal phase change temperature of around 30° C. and has a vapor pressure $P_i$ (saturated vapor pressure) which increases with the ambient temperature $T_i$ according to the Clapeyron formula:

$$\text{Log } Pi \text{ (mm Hg)} = A - \frac{B}{T_i (°K.)}$$

with A=7.9768 and B=1548. The values of A and B, which are constants characteristic of the fluid, vary according to the fluid used and are given by the manufacturer. Other fluids having a low phase change temperature at atmospheric pressure can be used instead.

Let $P_0$ denote the ambient pressure when the enclosure 21 is partially filled with the fluid 22, $T_0$ denote the temperature at which this filling takes place, $V_0$ denote the volume of fluid 22 used and $v_0$ denote the volume of air (or other gas) inside the enclosure. It is possible to calculate the optimal ratio $V_0/v_0$ for optimum slaving of the component temperature to ambient temperature. Knowing the coefficient of thermal expansion $\beta$ of (expressed in cm$^3$/(cm$^3$) (°C.)) of a given fluid (the value of the coefficient $\beta$ of FC 87 is $1.6 \times 10^{-3}$) and by solving the equation:

$$\frac{P_0 v_0}{T_0} = \frac{P_i v_i}{T_0}$$

with $v_i = v_0 - V_0 \cdot \beta \cdot \Delta T$, $v_i$ being the volume of air enclosed after filling at pressure $P_i$,
and where $\Delta T = T_i - T_0$, we obtain:

$$\frac{V_0}{v_0} = \frac{1}{\beta} \cdot \left[ \frac{1}{\Delta T} - \frac{P_0}{P_i \cdot \Delta T} - \frac{P_0}{P_i T_0} \right]$$

Solving this equation gives the optimal filling ratio $V_0/v_0$ for obtaining an enclosure whose fluid phase change temperature tracks ambient temperature.

The filling ratios $V_0/v_0$ in the table below were calculated for FC 87 assuming a filling temperature ($T_0$) of 20° C. at atmospheric pressure ($P_0$), the gas used being air at 20° C.:

| $T_i$ (°C.) | 35 | 40 | 45 | 50 | 55 | 60 | 65 |
|---|---|---|---|---|---|---|---|
| $P_i$ (Pa) | 1.175 | 1.41 | 1.69 | 2.01 | 2.38 | 2.80 | 3.28 |
| $V_0/v_0$ | 4.4 | 7.6 | 8.9 | 9.4 | 9.5 | 9.3 | 9 |

Note that for an enclosure filling ratio $V_0/v_0$ of 9.5 at ambient temperature 20° C., the ambient temperature when using the dissipating system can vary between 45° and 55° C. with the phase change temperature still slaved to the ambient temperature, that is to say 50° and 60° C., this temperature difference corresponding to the residual mechanical thermal resistance Rth between the bottom plate of the component and the fluid (estimated at 5° C.). If a filling ratio of only 8.9 had been chosen, there would not be sufficient fluid inside the enclosure and the fluid would not expand sufficiently for an ambient temperature of 50° C. Consequently, the increase in pressure would not be sufficient and there would be no condensation of the fluid, resulting in insufficient cooling of the component.

The operation of a dissipating system of this kind is described with reference to FIG. 5. The characteristic 51 in this figure shows the temperature (t°sc) of the bottom plate of the component 11 as a function of the ambient temperature ($T_i$). The bisecting line 50 shows the ambient temperature and t3 shows the selected maximum ambient temperature (55° C.).

Provided that the ambient temperature is below t2 (45° C.) the component 11 is mainly cooled by conduction of the heat energy that it generates through the body of the enclosure 21. The fluid 22 is not much involved in establishing thermal contact between the component 11 and the dissipator 12. As the ambient temperature approaches t2 the fluid 22 expands a little and the partial pressure increases due to the presence of air in the enclosure and the characteristic 51 begins to bend. When t2 is reached the fluid 22 vaporizes and the bottom plate temperature falls rapidly. The temperature difference ΔT3, which is in the order of 5° C., between the bottom plate and ambient temperature is due to the residual thermal resistance due to the mechanical connections between the component 11 and the dissipator 12. Beyond t2 the temperature of the bottom plate of the component 11 tracks the ambient temperature, the difference ΔT3 remaining constant.

Thus the increase in pressure inside the enclosure modifies the phase change temperature of the fluid so that the temperature of the bottom plate of the component tracks the ambient temperature, with a difference of ΔT3. In this embodiment the fluid 22 does not come into contact with the wall to which the dissipator 12 is fixed because this is prevented by the layer of air constituting the free gas volume optimized when filling the enclosure with the fluid.

Figure 3:
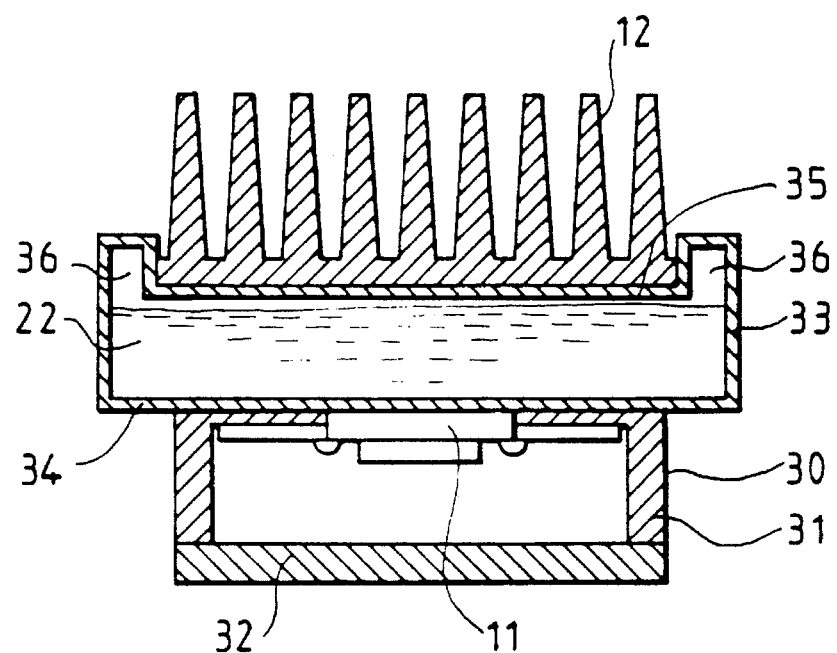

FIG. 3 shows a second embodiment of a dissipating system according to the invention.

Here the component 11 is a microwave transistor mounted in an electromagnetic shield box 30 constituted by a base 31 covered by a lid 32.

The base 30 contains a substrate on which electrically conductive tracks are formed, constituting microstrip lines. The microstrip lines are spot welded to the component 11. The substrate is usually a mixture of glass and PTFE and the component 11 is fixed into a notch in the base 30, usually by gluing or screwing. The notch enables the component 11 to be placed against an enclosure 33 containing the fluid 22. The enclosure 33 has two substantially parallel walls 34, 35 and the component 11 and the dissipator 12 are each fixed to one of the walls. The enclosure 33 also includes two shoulders 36, here on the same side as the dissipator 12, forming pressurized air concentration areas, the function of which is described in the description below of the characteristic 52 in FIG. 5.

A device as shown in FIG. 3 has three operating states: in a first operating state the ambient temperature is low and very much lower than the nominal phase change temperature, by 10° C. for example (for a phase change temperature of 30° C. at atmospheric pressure), the thermal resistance between the component 11 and the dissipator 12 is that due to the body of the enclosure, the fluid 22 making very little contribution as it is not in contact with the upper wall of the enclosure against which the component is fixed. This temperature difference is the same as that previously mentioned for the characteristic 51 and its value is ΔT1, in the order of 15° C. As the ambient temperature increases to a temperature t1 below the phase change temperature, a temperature in the order of 35° C., for example, the fluid 22 expands sufficiently to come into contact with the wall 35 against which the dissipator 12 is fixed and to cover the surface area occupied by the dissipator. The thermal resistance between the component 11 and the dissipator 12 is substantially that of the fluid 22. This thermal resistance is very low for a fluid such as FC 87, being in the order of 5.5 to 7.2 W/cm°K. The temperature difference ΔT2 depends on conduction by the fluid in the liquid state and its value is 10° C., for example. The air in the enclosure 33 is then compressed in the shoulders 36. This is the second operating stage. At the third stage the ambient temperature exceeds the phase change temperature and there is no temperature difference between the bottom plate of the component 11 and the dissipator 12. The thermal resistance is then due entirely to the mechanical arrangement employed and the temperature difference ΔT3 applies. This phenomenon continues across a wide temperature range and the characteristic 52 is then coincident with the characteristic 51.

For the fluid mentioned above and for 90% of the total volume of the enclosure occupied at 20° C. the pressure $P_i$ is 1.28 bars for an ambient temperature of 33° C. and 3.28 bars for an ambient temperature of 65° C.

Note that the constructions of the dissipating systems of FIGS. 2 and 3 make it possible to obtain an optimal heat dissipation cone because the heat source of the component is in thermal contact with all of the bottom plate of the dissipator. A dissipation cone corresponds to the conduction of the heat energy inside the enclosure towards the dissipator. The upper surface of this cone corresponds to that of the junction of the component, which is where the heat source is located.

Figure 4:
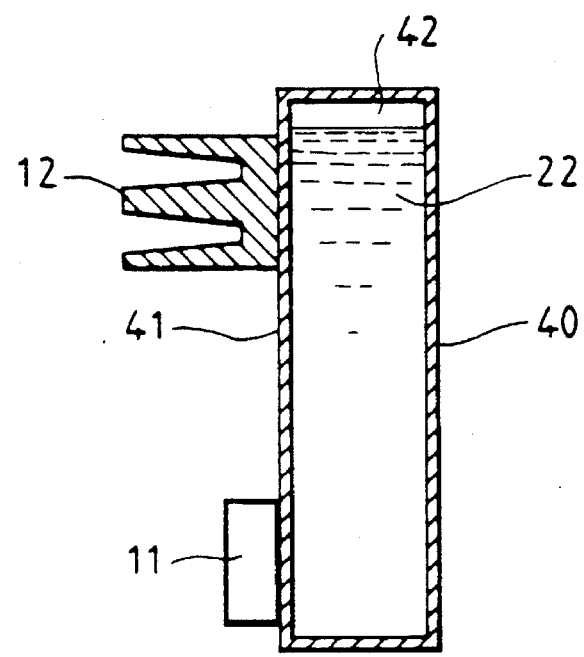

FIG. 4 shows a third embodiment of the dissipating system of the invention.

In this figure the component 11 is fixed to the same wall 41 of the enclosure 40 as the dissipator 12. The dissipator 12 is disposed above the component 11 and the enclosure 40 is therefore in a vertical position. As in FIG. 3 the enclosure 40 includes an area 42 filled with air which is pressurized when the ambient temperature causes expansion of the fluid.

Other embodiments are naturally feasible and the shape of the enclosure and the arrangements of the air zones may be adapted to suit different requirements, for example. It is also feasible to substitute a different gas for the air, what is essential being that expansion of the fluid causes an increase in pressure in the enclosure, this pressure corresponding to the partial pressure due to this gas.

The main advantage of the invention is that the component to be cooled is held substantially at ambient temperature and that when the ambient temperature is low the component is not cooled with the assistance of the fluid of the enclosure but only by the metal components employed (enclosure body serving as a heatsink). On the other hand, if the ambient temperature increases the component is cooled to the new ambient temperature (to within ΔT3). Consequently, the component is held within a relatively narrow range of temperatures and its operating characteristics are preserved. It is desirable not to modify the temperature of the component so that it tracks the ambient temperature if the latter is low.

In a heat pipe-based cooling system the enclosure contains only the fluid providing transfer of heat and the operating point is therefore conditioned only by the Clapeyron formula because the expansion of the fluid associated with the increase in the ambient temperature does not cause any increase in pressure and so does not modify the phase change temperature. In a heat pipe, once the fluid is introduced, the air introduced during the introduction of the fluid is pumped out so that the pressure inside the heat pipe is equal to the saturated vapor pressure and there is therefore only the fluid in the heat pipe.

In contradistinction to this, the invention employs a sealed enclosure containing a volume of gas different from the fluid employed, the volume of fluid being large. In this way expansion of the fluid is combined with the effect of the Clapeyron formula so that the fluid phase change temperature is slaved to the ambient temperature.

The system of the invention combines effectiveness, low cost and compactness and it is equally feasible to fix a plurality of components to be cooled to one and the same enclosure. The enclosure may also be made in one piece with the heat dissipator and/or with a shield box such as that shown in FIG. 3.

We claim:

1. A system for dissipating heat energy generated by an electronic component comprising a sealed metal enclosure the interior volume of which contains a liquid having a phase change temperature at atmospheric pressure, said component being fixed to the outside wall of said enclosure and connected to a heat dissipator by said enclosure, characterized in that the phase change temperature of said liquid at atmospheric pressure is less than a given maximum ambient temperature and in that said enclosure also contains a volume of a gas, said gas not being a vapor of said liquid and being only a gas at atmospheric pressure so that variation in the ambient temperature causes a variation in the pressure inside said enclosure which modifies the phase change temperature of said liquid, further characterized in that the ratio by which said enclosure is filled with said liquid is equal to:

$$\frac{V_0}{v_0} = \frac{1}{\beta} \cdot \left[ \frac{1}{\Delta T} - \frac{P_0}{P_i \cdot \Delta T} - \frac{P_0}{P_i T_0} \right]$$

with $v_0 = v_i - v_0 \cdot \beta \cdot \Delta T$
where:

$V_0$ is the volume of liquid used;

$v_0$ is the residual volume of gas inside the enclosure under initial conditions;

$\beta$ is the coefficient of thermal expansion of the liquid;

$\Delta T = T_i - T_0$ where $T_i$ is the maximum ambient temperature and $T_0$ is the temperature at which the enclosure is filled;

$P_0$ is the ambient pressure when the enclosure is filled;

$P_i$ is the pressure inside the enclosure at temperature $T_i$;

$v_i$ is the volume of the gas in the enclosure at the pressure $P_i$.

2. A system according to claim 1 characterized in that said enclosure has two substantially parallel walls and in that said component and said dissipator are each fixed to a respective one of said walls.

3. A system according to claim 1 characterized in that said component and said dissipator are fixed to the same wall of said enclosure.

4. A system according to claim 1 characterized in that said enclosure includes at least one pressurized gas concentration region which is not filled with said liquid when the ambient temperature is less than said maximum ambient temperature, said region being disposed for receiving said gas as said liquid expands at ambient temperature ever said phase change temperature, whereby said expanded liquid is operative to establish thermal contact between said component and said dissipator.

5. A system according to claim 1 characterized in that said component is a microwave transistor mounted in an electromagnetic shield box.

6. System according to claim 1 characterized in that said gas is air.

7. A sealed metal enclosure whose interior volume contains a liquid characterized in that the phase change temperature of said liquid at atmospheric pressure is less than a given maximum ambient temperature and in that said enclosure also contains a volume of a gas at said atmospheric pressure, said gas not being a vapor of said liquid so that variation in the ambient temperature causes a variation in pressure inside said enclosure which modifies the phase change temperature of said liquid, further characterized in that the ratio by which said enclosure is filled with said liquid is equal to:

$$\frac{V_0}{v_0} = \frac{1}{\beta} \cdot \left[ \frac{1}{\Delta T} - \frac{P_0}{P_i \cdot \Delta T} - \frac{P_0}{P_i T_0} \right]$$

with $v_0 = v_i + v_0 \cdot \beta \cdot \Delta T$
where:

$V_0$ is the volume of liquid used;

$v_0$ is the residual volume of gas inside the enclosure under initial conditions;

$\beta$ is the coefficient of thermal expansion of the liquid;

$\Delta T = T_i - T_0$ where $T_i$ is the maximum ambient temperature and $T_0$ is the temperature at which the enclosure is filled;

$P_0$ is the ambient pressure when the enclosure is filled;

$P_i$ is the pressure inside the enclosure at temperature $T_i$;

$v_i$ is the volume of the gas in the enclosure at the pressure $P_i$.

8. An enclosure according to claim 7 characterized in that it includes at least one pressurized gas concentration region which is not filled with said liquid when the ambient temperature is less than said maximum ambient temperature, said region being disposed for receiving said gas when pressurized as said liquid expands at ambient temperatures over said phase change temperature, whereby said expanded liquid is operative to establish thermal contact between an electronic component and a heat dissipator.

9. Enclosure according to claim 7 characterized in that said gas is air.

* * * * *